United States Patent
Grass

[19]

[11] Patent Number: 6,090,647
[45] Date of Patent: Jul. 18, 2000

[54] CAPACITOR FOR A SEMICONDUCTOR DEVICE

[75] Inventor: Anthony Grass, Boise, Id.

[73] Assignee: Micron Technology, Inc., Boise, Id.

[21] Appl. No.: 09/034,213

[22] Filed: Feb. 27, 1998

Related U.S. Application Data

[63] Continuation of application No. 08/614,713, Mar. 13, 1996, Pat. No. 5,726,485.

[51] Int. Cl.⁷ .......................... M01L 21/00; M01L 21/336
[52] U.S. Cl. .......................... 438/151; 438/152; 438/272
[58] Field of Search ................................ 438/8, 106, 151, 438/152, 107, 268, 272, 273

[56] References Cited

U.S. PATENT DOCUMENTS

| | | | |
|---|---|---|---|
| 4,339,723 | 7/1982 | Yee | 328/111 |
| 4,866,507 | 9/1989 | jacobs et al. | 357/74 |
| 4,879,631 | 11/1989 | Johnson et al. . | |
| 5,032,892 | 7/1991 | Chern et al. . | |
| 5,091,769 | 2/1992 | Eichelberger | 357/72 |
| 5,149,662 | 9/1992 | Eichelberger | 437/8 |
| 5,155,656 | 10/1992 | Narashimhan et al. . | |
| 5,266,821 | 11/1993 | Chern et al. . | |
| 5,304,506 | 4/1994 | Porter et al. . | |
| 5,329,237 | 7/1994 | Horch . | |
| 5,376,817 | 12/1994 | Seyyedy et al. | 257/374 |
| 5,485,029 | 1/1996 | Crabbe et al. . | |
| 5,770,476 | 6/1998 | Stone | 438/106 |

OTHER PUBLICATIONS

Wolf, Stanley "Silicon Processing for the VLSI Era vol. 2: Process Integration", Lattice Press, pp. 381–392 and 498–500, 1990.

Technology Advances Electronic Design Oct. 13, 1995.

*Primary Examiner*—Richard Elms
*Assistant Examiner*—Michael S. Lebentritt

[57] ABSTRACT

A semiconductor device comprises a substrate such as a semiconductor wafer having a major surface, a first conductive layer formed over the major surface, and a second conductive layer formed over the first conductive layer with the first and second conductive layers having a capacitance therebetween. A semiconductor layer is formed over the first and second conductive layer, the semiconductor layer having a diffusion region such as a transistor source, drain, and/or channel. An inventive method for forming the inventive structure comprises the steps of forming a first conductive layer over a substrate and forming a second conductive layer over the first conductive layer. Next, a semiconductor layer is formed over the second conductive layer and a transistor diffusion region, such as a source, drain, and/or channel is formed in the semiconductor layer.

14 Claims, 2 Drawing Sheets

CAPACITOR FOR A SEMICONDUCTOR DEVICE

PRIORITY INFORMATION

This is a continuation of U.S. application Ser. No. 08/614,713 filed Mar. 13, 1996 and issued Mar. 10, 1998 as U.S. Pat. No. 5,726,485.

FIELD OF THE INVENTION

This invention relates to the field of semiconductor manufacture, and more particularly to a capacitor structure for decreasing noise on a semiconductor device and to a method of forming the structure.

BACKGROUND OF THE INVENTION

Capacitors such as decoupling capacitors on semiconductor devices are essential components used to filter noise that may be present between operating supplies such as power and ground. Some semiconductor fabrication processes construct decoupling capacitors on a silicon substrate by forming one electrode into the substrate itself and then forming a second electrode from an overlying conductive material with the two electrodes being separated by a dielectric material. Various capacitors and methods for forming capacitors such as decoupling capacitors, both on a semiconductor chip and on a printed circuit board, are described in the following U.S. patents each assigned to Micron Technology, Inc., each of which is incorporated herein by reference: U.S. Pat. No. 4,879,631 issued Nov. 7, 1989 to Johnson et al.; U.S. Pat. No. 5,032,892 issued Jul. 16, 1991 to Chern et al.; U.S. Pat. No. 5,155,656 issued Oct. 13, 1992 to Narashimhan et al.; U.S. Pat. No. 5,304,506 issued Apr. 19, 1994 to Porter et al.; U.S. Pat. No. 5,266,821 issued Nov. 30, 1993 to Chern et al.; U.S. Pat. No. 5,329,237 issued Jul. 12, 1994 to Horch.

The formation of capacitors over the surface of a semiconductor can leave the substrate and capacitor dielectric susceptible to subsequent process steps such as future dopant implants that can penetrate into the silicon substrate and thereby short the two capacitor plates together through the capacitor dielectric. Also, subsequent plasma etches can further damage the capacitor by reducing the overall surface area of the second electrode if it is not protected.

An improved capacitor and fabrication process therefor which reduces the problems associated with some other capacitors and methods of capacitor formation would be desirable.

SUMMARY OF THE INVENTION

One embodiment of the inventive semiconductor device comprises a substrate such as a silicon, gallium arsenide, or other semiconductor material having a major surface, a first conductive layer such as a metal formed over the major surface, and a second conductive layer such as a metal formed over the first conductive layer. The first and second conductive layers, when separated by a dielectric layer, form a capacitor such as a decoupling capacitor. The device further comprises a semiconductor layer formed over the first and second conductive layers, the semiconductor layer having a diffusion region such as a transistor source or drain formed therein.

Various objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENTS

Figure 1:
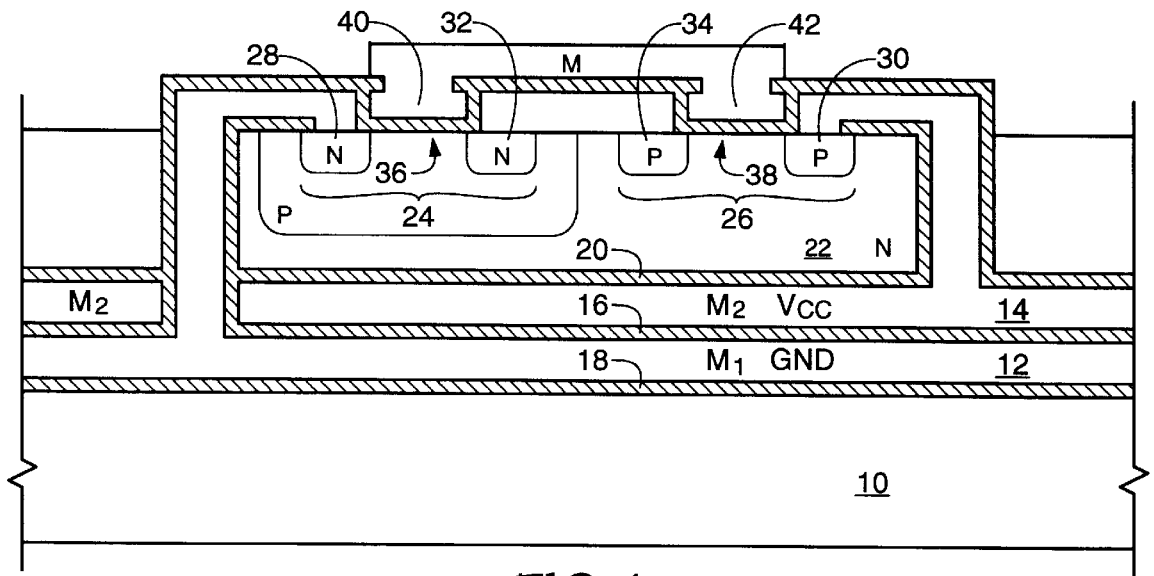
FIG. 1 is a cross section depicting one embodiment of the invention and use therefor.
Figure 2:
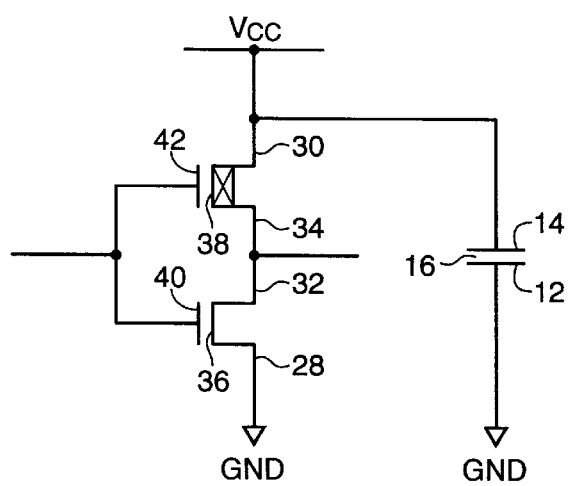
FIG. 2 is a schematic of the FIG. 1 structure.

One embodiment of the inventive semiconductor device, referring to FIG. 1 and schematically shown in FIG. 2, comprises a substrate 10 of silicon, gallium arsenide, or other semiconductor material having a major surface, and a first conductive layer 12 formed over the major surface. The device further comprises a second conductive layer 14 over the first conductive layer, and the first and second conductive layers can comprise a metal, for example tungsten, titanium, or aluminum, an alloy, or other workable materials. The first and second layers have a capacitance therebetween which is determined partly by the thickness of a dielectric layer 16 between the two layers (which form two capacitor plates), partly by the dielectric constant of the insulator between the two plates, and partly by the geometry of the layers. The bottom plate 12 of the capacitor is optionally separated from the substrate 10 by a dielectric layer 18.

A dielectric layer 20 over the second plate 14 separates the second plate from a semiconductor layer 22 such as an epitaxial silicon layer formed over the capacitor. This structure can provide any number of uses, for example to form various types and number of devices thereon. FIG. 1 illustrates one use of the structure having a pair of transistors cross connected to form an inverter. First 24 (an n-channel metal oxide semiconductor, NMOS) and second 26 (a p-channel metal oxide semiconductor, PMOS) transistors are formed over and within the semiconductor layer 22. Transistor diffusion regions, i.e. sources 28, 30, drains 32, 34, and channels 36, 38 are formed within the semiconductor layer 22, and gates 40, 42 are formed over the semiconductor layer 22 according to means known in the art. The transistors are therefore formed over the first and second conductive layers as well.

In this particular use of the invention, the NMOS transistor source 28 is electrically coupled with the bottom capacitor plate 12, which is connected with ground. The PMOS transistor source 30 is electrically coupled with the top capacitor plate 14, which is connected with $V_{CC}$, and the transistor drains 32, 34 of the PMOS and NMOS transistors are electrically connected.

To maximize the performance of the buried capacitor for some uses the ground 12 and $V_{CC}$ 14 plates can cover the entire surface area of the substrate (allowing for any vias required to contact an underlying plate). This can be completed by forming the optional dielectric layer 18 such as a grown or deposited oxide layer on the entire surface of a semiconductor wafer 10, then forming the layer 12 which will become the bottom plate of the capacitor over the wafer surface. The next dielectric layer (the interplate dielectric) 16 and then the top capacitor plate 14 are formed. Wafer processing continues, for example to form an insulation layer over the top plate, to form a semiconductor layer over the insulation layer, and by forming any transistors and connections to either capacitor plate. The wafer is then diced to singularize a plurality of die. It should be noted that process which forms the plates can be repeated any number of times to form a plurality of ground and $V_{CC}$ planes.

Figure 3:
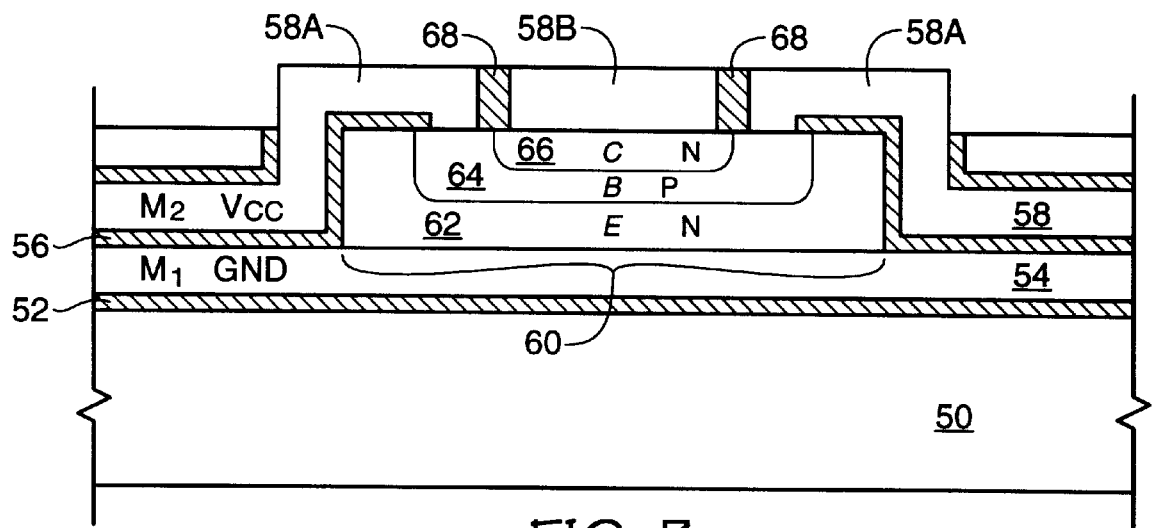
FIG. 3 is a cross section depicting another embodiment of the invention and use therefor.
Figure 4:
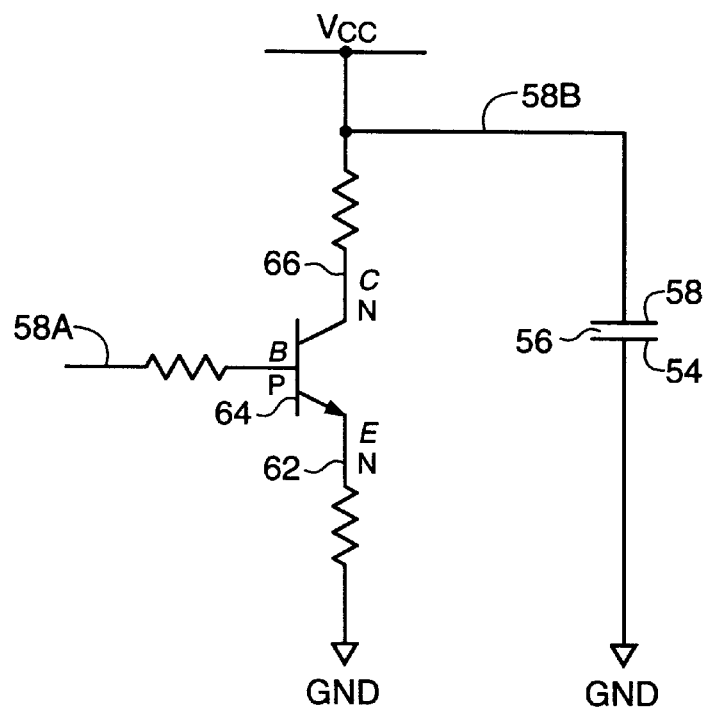
FIG. 4 is a schematic of the FIG. 3 structure.

A second use of the invention, a bipolar junction transistor (BJT) device configured as an inverter, is structurally shown in FIG. 3 and schematically represented by FIG. 4. This use of the invention comprises a substrate 50, an optional dielectric 52, a first capacitor plate 54 connected to ground, an interplate dielectric 56, a second plate 58 connected to $V_{CC}$, and a semiconductor layer 60 having an emitter 62, a base 64, and a collector 66. Dielectric 68 divides metal2 58 to allow its attachment to both the base 64 and the collector 66 through portions of Metal2 layer 58A and 58B respectively. It should be noted the inverters shown in the FIGS. herein are merely possible uses of the invention, while the invention can be used in many different structures.

A method for forming the inventive device can comprise the steps of forming a dielectric layer such as oxide over the semiconductor substrate such as a wafer. A conductive bottom capacitor plate such as a blanket metal layer can be formed over the dielectric layer using any number of methods, for example sputter, chemical vapor deposition (CVD), plasma-enhanced CVD, or reflow techniques. The bottom plate can also be patterned. Another dielectric layer is formed over the bottom plate and the top plate is formed, for example using processes used to form the bottom plate. A third dielectric layer is formed over the top capacitor plate then a semiconductor layer is formed over the third dielectric layer. The semiconductor layer can be formed from a silicon epitaxial silicon layer, although other silicon or semiconductor layers may function adequately. In the use as shown in FIG. 1 the semiconductor layer is be doped to provide for adequate semiconductive properties, for example to form the transistor diffusion regions shown in the semiconductor layer. As shown in FIG. 1, the diffusion regions, such as the sources and/or drains, can be connected to one of the capacitor plates and connected with diffusion regions of other transistor regions depending on the use of the invention. The plates can be connected with various signals such as power and ground, or can form a bus to pass other signals.

A semiconductor device comprising the invention could conceivably be attached along with other devices to a printed circuit board, for example to a computer motherboard or as a part of a memory module used in a personal computer, a minicomputer, or a mainframe. The inventive device could further be useful in other electronic devices related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Other embodiments of the invention will become apparent to those skilled in the art from reading this description. For example, the conductive and dielectric layers can each comprise a plurality of individual layers, such as oxide-nitride-oxide for each dielectric layer, and metal-metal alloy or metal1-metal2 for the conductive layers. Further, each capacitor plate can comprise a number of different layouts, such as: a blanket bottom plate and patterned top plate; top and bottom plates which extend over the entire surface of the die or wafer except for any required vias for connection to underlying layers; multiple conductive layers, for example alternating $V_{CC}$ and ground planes; or various other configurations depending on the specific use of the invention. Further, the capacitance can be optimized for any particular use, for example to function as a high-pass filter, by altering the thickness of the dielectric layer between the two plates, by choosing a dielectric material which has a desirable dielectric constant, or by altering the geometry of the conductive plates and dielectric. It is therefore contemplated that the appended claims will cover any such modifications or embodiments as fall within the scope of the invention.

What is claimed is:

1. A method for forming a filter for use with a semiconductor device comprising the following steps:

provding a semiconductor substrate having a major surface;

forming a first conductive layer over essentially all of said substrate;

forming a second conductive layer over said first conductive layer;

connecting one of said first and second conductive layers to a power signal and connecting one of said first and second conductive layers to a ground signal;

forming a semiconductor layer over said second conductive layer; and forming at least first and second doped regions in said semiconductor layer, wherein each of said first and second doped regions is connected to one of said first and second conductive layers.

2. The method of claim 1 wherein said step of forming said semiconductor layer comprises the step of forming an epitaxial layer.

3. The method of claim 1 further comprising the following steps:

forming a first oxide layer prior to said step of forming said first conductive layer, said first oxide layer separating said semiconductor substrate from said first conductive layer; and forming a second oxide layer prior to said step of forming said second conductive layer, said second oxide layer separating said first conductive layer from said second conductive layer.

4. A method of forming a semiconductor device comprising the following steps:

forming a power plane, a ground plane, and an oxide layer interposed therebetween over a semiconductor substrate such that said power and ground planes and said oxide layer form at least part of a capacitor;

forming a semiconductor layer over said power and ground planes; and forming at least first, second, third, and fourth doped regions in said semiconductor layer, wherein said first and second doped regions have a channel region therebetween and said third and fourth regions have a channel region therebetween, and wherein said first doped region is electrically coupled with said ground plane and said fourth doped region is electrically coupled with said power plane.

5. The method of claim 4 further comprising the step of electrically coupling said second and said third doped regions.

6. The method of claim 4 wherein said step of forming said power and ground planes each comprise the step of forming a polycrystalline silicon layer.

7. The method of claim 4 further comprising the step of electrically coupling said first doped region and said ground plane using a substantially vertical layer of polycrystalline silicon extending along a sidewall of said semiconductor layer.

8. The method of claim 7 further comprising the step of electrically coupling said fourth doped region and said power plane using a substantially vertical layer of polycrystalline silicon extending along a sidewall of said semiconductor layer.

9. A method used during the formation of a semiconductor device comprising the following steps:

provide a semiconductor substrate comprising a semiconductor wafer having a first dielectric layer formed thereover;

forming a first metal layer over said first dielectric layer and a second dielectric layer over said metal layer;

forming a second metal layer over said second dielectric layer;

providing a power signal and a ground signal wherein one of said metal layers is electrically coupled with said power signal and the other of said metal layers is electrically coupled with said ground signal; and forming an epitaxial silicon layer over said first and second metal layers.

10. The method of claim 9 further comprising the following steps:

doping said epitaxial silicon layer with a dopant having a first type conductivity; and doping a first region of said doped epitaxial silicon layer with a dopant having a second type conductivity different from said first type conductivity wherein a second region of said doped epitaxial silicon layer remains undoped with said dopant having said second type conductivity.

11. The method of claim 9 further comprising the step of forming a transistor base, emitter, and collector within said epitaxial silicon layer.

12. The method of claim 10 further comprising the following steps:

forming a transistor source and a transistor drain in said first region and a transistor source and a transistor drain in said second region.

13. The method of claim 12 further comprising the step of electrically coupling said first and second regions of said doped epitaxial silicon layer with a metal layer.

14. The method of claim 13 wherein said step of electrically coupling said first and second regions forms a portion of an inverter.

* * * * *